(12) United States Patent
Chen et al.

(10) Patent No.: US 10,432,181 B2
(45) Date of Patent: Oct. 1, 2019

(54) DATA CONVERTER AND IMPEDANCE MATCHING CONTROL METHOD THEREOF

(71) Applicant: REALTEK SEMICONDUCTOR CORPORATION, Hsinchu (TW)

(72) Inventors: Chih-Lung Chen, Hsinchu County (TW); Sheng-Hsiung Lin, Tainan (TW); Jie-Fan Lai, Hsinchu (TW); Shih-Hsiung Huang, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/982,614

(22) Filed: May 17, 2018

(65) Prior Publication Data

US 2019/0068179 A1 Feb. 28, 2019

(30) Foreign Application Priority Data

Aug. 29, 2017 (TW) .............................. 106129399 A

(51) Int. Cl.
| | |
|---|---|
| *H03K 5/1252* | (2006.01) |
| *H03H 11/28* | (2006.01) |
| *H03K 5/24* | (2006.01) |
| *H03M 1/12* | (2006.01) |

(52) U.S. Cl.
CPC .......... *H03K 5/1252* (2013.01); *H03H 11/28* (2013.01); *H03K 5/24* (2013.01); *H03M 1/12* (2013.01)

(58) Field of Classification Search
CPC ......... H03K 5/1252; H03K 5/24; H03M 1/12; H03H 11/28
See application file for complete search history.

(56) References Cited

U.S. PATENT DOCUMENTS

| 4,385,286 A | 5/1983 | Haque | |
|---|---|---|---|
| 8,456,335 B2 * | 6/2013 | Oshima | H03M 1/1052 341/118 |
| 8,981,973 B2 * | 3/2015 | Kumar | H03M 1/0617 341/118 |

(Continued)

OTHER PUBLICATIONS

Pedro M. Figueiredo et al. "Kickback noise reduction techniques for CMOS latched comparators" Article in circuits and Systems II: Express Briefs, IEEE Transactions on 53(7):541-545—Aug. 2006 DOI: 10.1109/TCSII.2006.875308.

*Primary Examiner* — Thomas J. Hiltunen
(74) *Attorney, Agent, or Firm* — WPAT, PC

(57) ABSTRACT

A data converter and an impedance matching control method are provided. The data converter includes a comparator, a capacitor array as well as a switch and impedance matching circuit. The comparator includes a first input terminal and a second input terminal. The capacitor array includes a plurality of capacitors, and a first end of each capacitor is coupled to the first input terminal or the second input terminal. The switch and impedance matching circuit is coupled to a second end of a target capacitor among the capacitors and configured to couple the second end to a first reference voltage or a second reference voltage according to a control signal and adjust an impedance according to an impedance adjusting signal, in which the impedance is the impedance of the switch and impedance matching circuit. The first reference voltage is different from the second reference voltage.

7 Claims, 9 Drawing Sheets

(56) References Cited

U.S. PATENT DOCUMENTS

| | | | | |
|---|---|---|---|---|
| 9,325,327 B1 * | 4/2016 | Paul | .................. | H03K 19/0944 |
| 9,525,409 B2 * | 12/2016 | Hurrell | ............... | H03M 1/1245 |
| 10,020,068 B2 * | 7/2018 | Hurrell | .................. | G11C 27/02 |

* cited by examiner

DATA CONVERTER AND IMPEDANCE MATCHING CONTROL METHOD THEREOF

BACKGROUND

1. Field of the Disclosure

The present disclosure generally relates to data converters, and, more particularly, to impedance matching for data converters.

2. Description of Related Art

FIG. 1 is a circuit diagram of a conventional single-stage comparator. The comparator 100 mainly includes a transistor 120 and a transistor 130. When the comparator 100 is switched from the reset state (the switch 110 being on) to the comparison state (the switch 110 being off), the signals on the output terminal Vo− and the output terminal Vo+ are kicked back to the negative terminal (inverting input terminal) Vi− and the positive terminal (non-inverting input terminal) Vi+ of the comparator 100 respectively through the parasitic capacitance 125 of the transistor 120 and the parasitic capacitance 135 of the transistor 130, resulting in erroneous comparison results.

Although, in theory, kickback noise becomes a common mode component of the input signal for a two-stage comparator, the comparator is inevitably affected by kickback noise in cases where the equivalent impedance coupled to the negative terminal of the comparator does not match the equivalent impedance coupled to the positive terminal of the comparator.

SUMMARY

In view of the issues of the prior art, an object of the present disclosure is to provide a data converter and an impedance matching control method for the data converter, so as to make the comparator of the data conversion circuit less susceptible to kickback noises.

A data converter is provided. The data converter includes a comparator, a capacitor array, and a switch and impedance matching circuit. The comparator has a first input terminal and a second input terminal. The capacitor array includes multiple capacitors. A first end of each capacitor is coupled to the first input terminal or the second input terminal. The switch and impedance matching circuit is coupled to a second end of a target capacitor among the capacitors and configured to couple the second end to a first reference voltage or a second reference voltage according to a control signal and adjust an impedance of the switch and impedance matching circuit according to an impedance adjusting signal. The first reference voltage is different from the second reference voltage.

A method for controlling impedance matching of a data converter is provided. The data converter includes a comparator, a capacitor array, and a switch and impedance matching circuit. The comparator has a first input terminal and a second input terminal. The capacitor array includes multiple capacitors, each having a first end coupled to the first input terminal or the second input terminal. The switch and impedance matching circuit is coupled to a second end of a target capacitor among the capacitors and couples the second end to a first reference voltage or a second reference voltage according to a control signal. The method includes steps of: measuring a circuit characteristic of the data converter; and adjusting the switch and impedance matching circuit according to the circuit characteristic measured so that the equivalent impedance between the second end of the target capacitor and the first reference voltage is substantially equal to the equivalent impedance between the second end of the target capacitor and the second reference voltage.

According to this disclosure, the data converter and the impedance matching control method for the data converter can reduce kickback noises on the comparator. Compared with traditional technologies, this disclosure can improve the performance of data converters.

These and other objectives of the present disclosure no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a data converter and an impedance matching control method. On account of that some or all elements of the data converter could be known, the detail of such elements is omitted provided that such detail has little to do with the features of this disclosure and this omission nowhere dissatisfies the specification and enablement requirements. Some or all of the processes of the impedance matching control method may be implemented by software and/or firmware. A person having ordinary skill in the art can choose components or steps equivalent to those described in this specification to carry out the present disclosure, which means that the scope of this disclosure is not limited to the embodiments in the specification.

Figure 1:
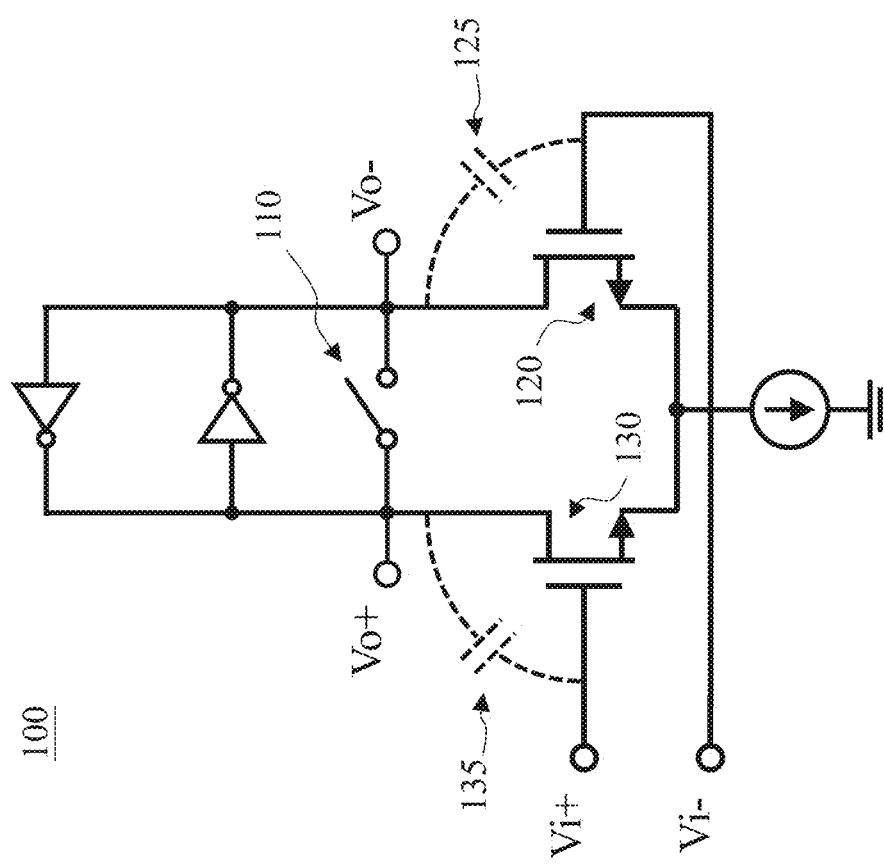
FIG. 1 illustrates a circuit diagram of a conventional single-stage comparator.
Figure 2A:
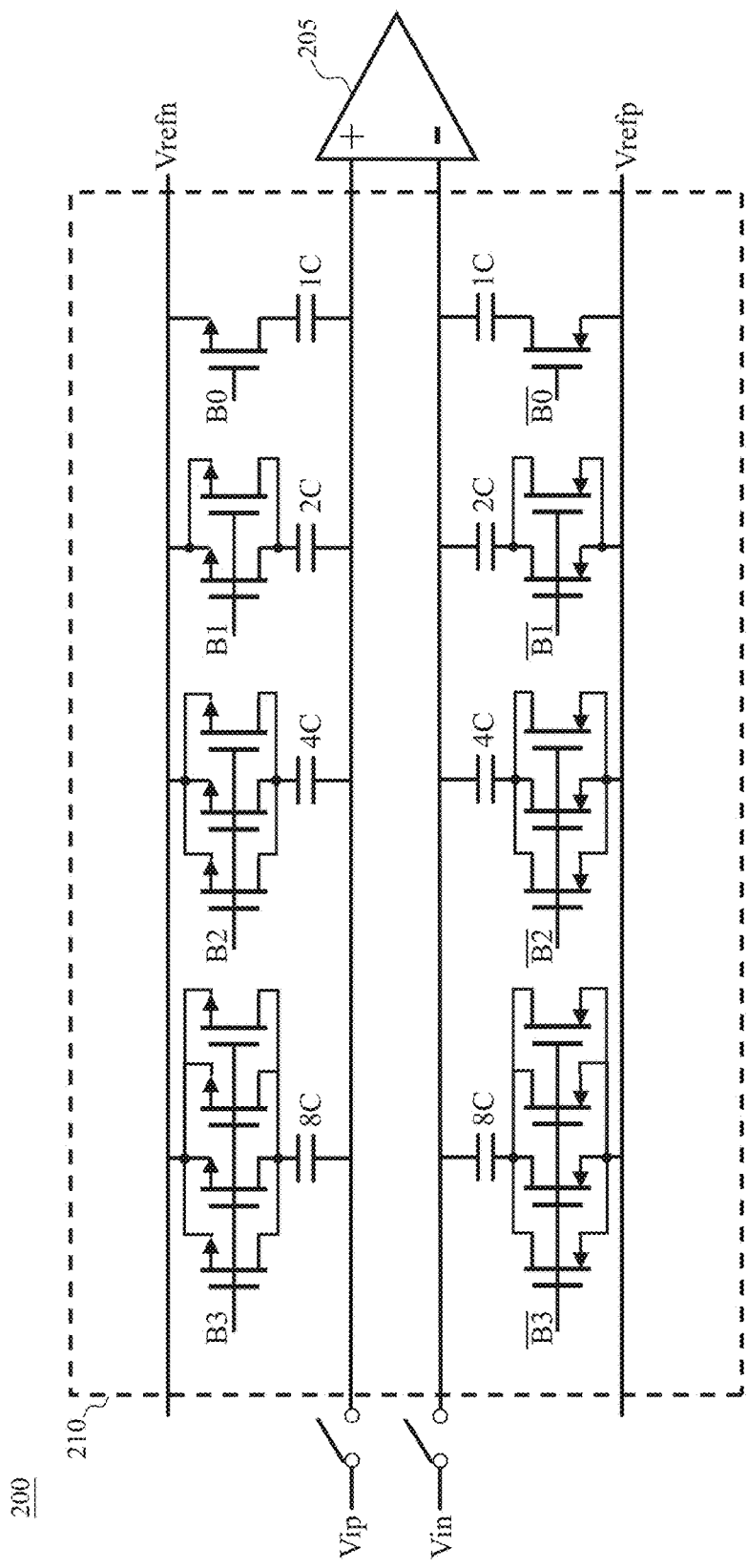
FIGS. 2A-2B illustrate circuit diagrams of a data converter.
Figure 2B:
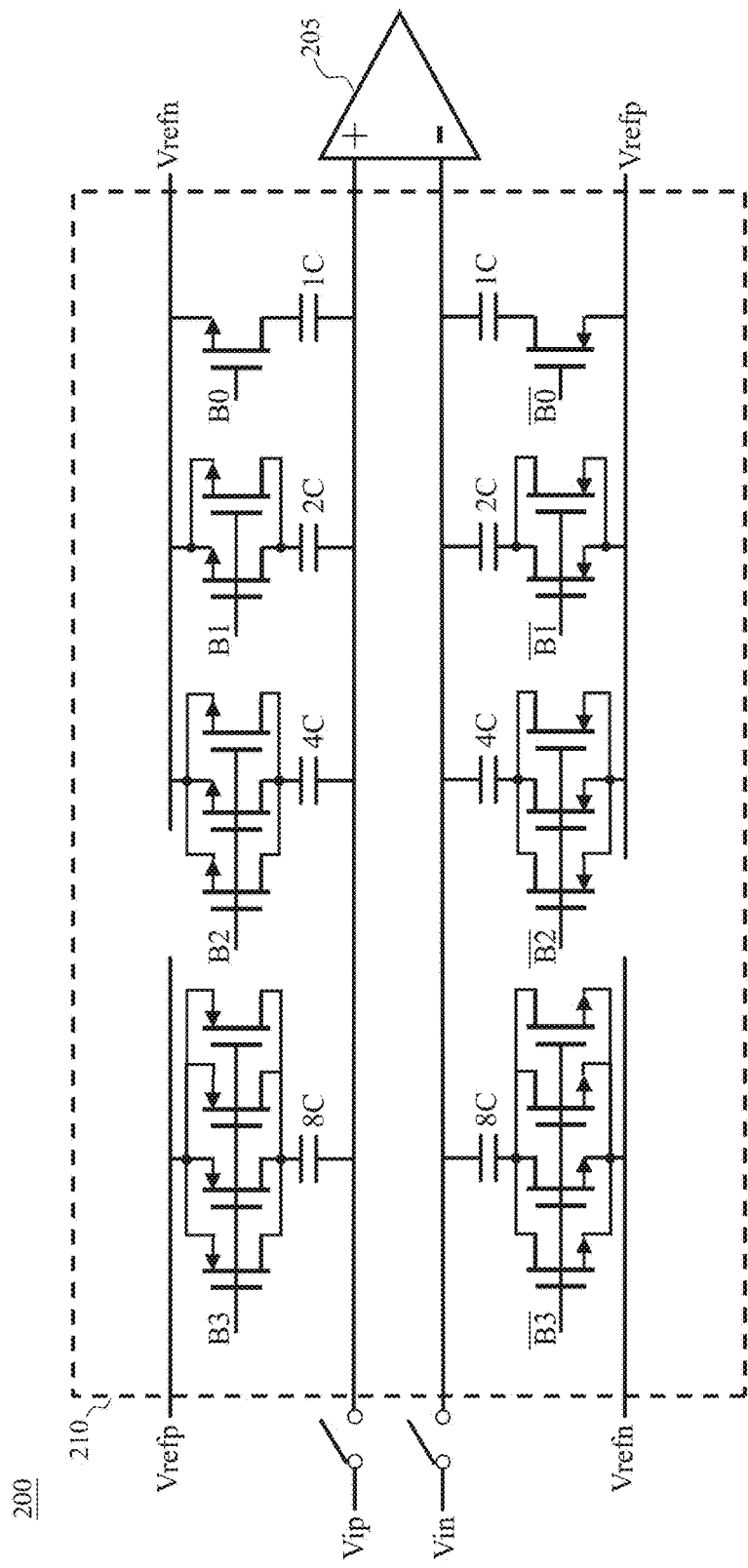

FIG. 2A and FIG. 2B are circuit diagrams of a data converter. The data converter 200 includes a comparator 205 and a digital-to-analog converter (DAC) 210, and the application of the data converter 200 may include, but not limited to, a successive approximation analog-to-digital converter (ADC). The DAC 210 aims at converting the digital code B (including bits B0 to B3) into analog signals. The exemplary operating status in FIG. 2A corresponds to the input signal being close or equal to full swing (i.e., corresponding to the digital code B being 1111 or 0000). In this case, the capacitor array (four capacitors 1C, 2C, 4C, and 8C being illustrated herein as an example) connected to the positive terminal of the comparator 205 is coupled to the reference voltage Vrefn through switch(es) of a first type (e.g., an N-type Metal-Oxide-Semiconductor Field-Effect Transistor (N-MOSFET, hereinafter referred to as NMOS)), while the capacitor array connected to the negative terminal of the comparator 205 is coupled to the reference voltage Vrefp through switch(es) of a second type (e.g., a P-type Metal-Oxide-Semiconductor Field-Effect Transistor (P-MOSFET, hereinafter referred to as PMOS)). The reference voltage Vrefn is different from the reference voltage Vrefp. The exemplary operating status as in FIG. 2B corresponds to the input signal being close or equal to the common-mode voltage (i.e., corresponding to the digital code B being 1000 or 0111). In this case, among the capacitors connected to the positive terminal of the comparator 205, the capacitor 8C is coupled to the reference voltage Vrefp through the PMOS(s) while other capacitors coupled to the reference voltage Vrefn through the NMOS (s), and among the capacitors connected to the negative terminal of the comparator 205, the capacitor 8C is coupled to the reference voltage Vrefn through the NMOS(s) while other capacitors coupled to the reference voltage Vrefp through the PMOS(s).

Ideally, for both the circuit configuration of FIG. 2A and the circuit configuration of FIG. 2B, when the turn-on resistances of the NMOS and PMOS are equal, the equivalent impedance coupled to the positive terminal of the comparator 205 is substantially equal to the equivalent impedance coupled to the negative terminal of the comparator 205. However, when the turn-on resistance of the NMOS is different from that of the PMOS, the equivalent impedance of the positive terminal of the comparator 205 does not match the equivalent impedance of the negative terminal. Therefore, there is discrepancy in amplitude between kickback noise received at the positive terminal of the comparator 205 and that received at the negative terminal, resulting in glitch mismatch between the two terminals of the comparator 205. Thus, it can be concluded that the level of impedance mismatch between the two input terminals of the comparator 205 is related to the input signals Vin and Vip.

Figure 3A:
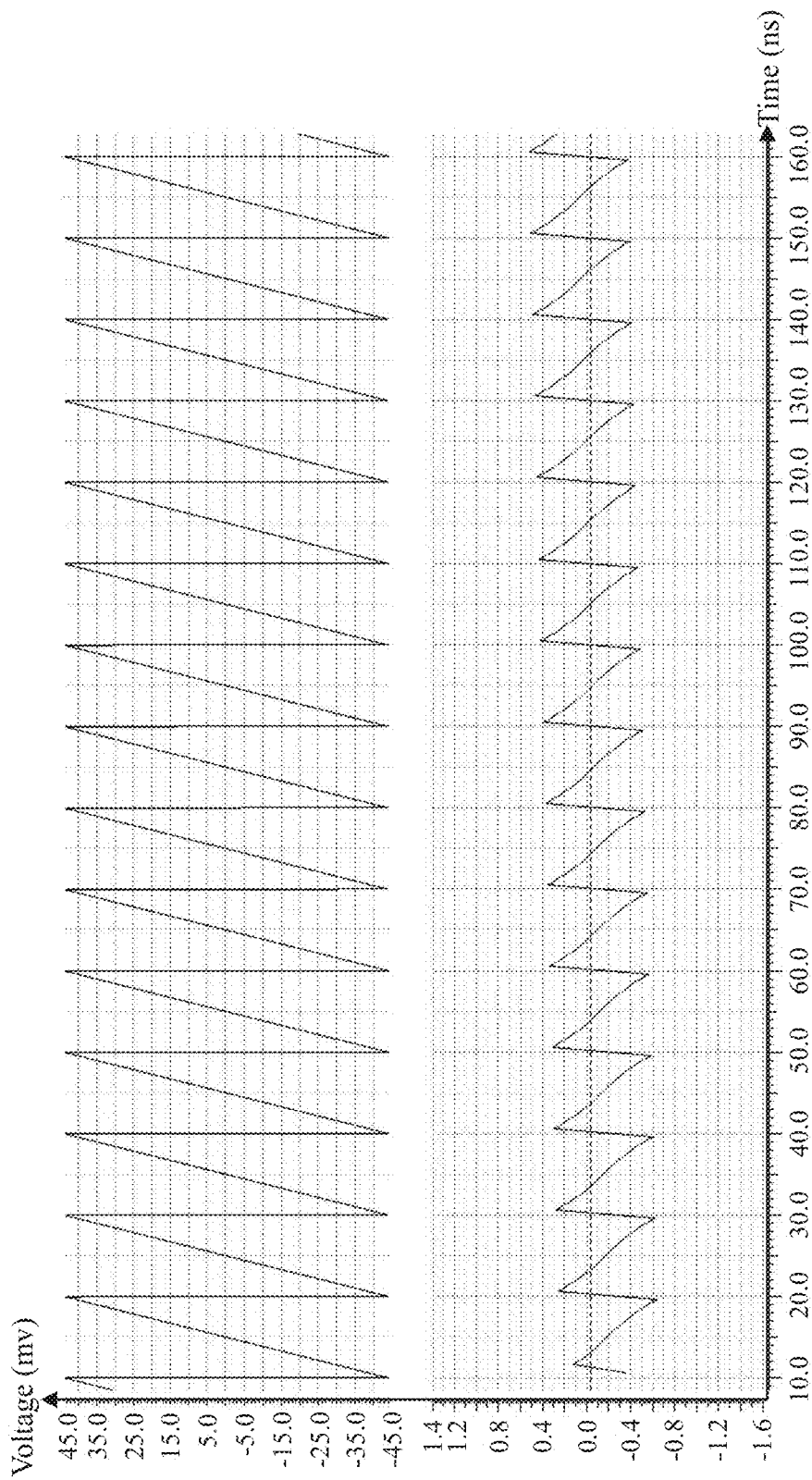
FIGS. 3A-3C illustrate the differences in kickback voltages between the two input terminals of a comparator corresponding to different turn-on resistances of transistors.
Figure 3B:
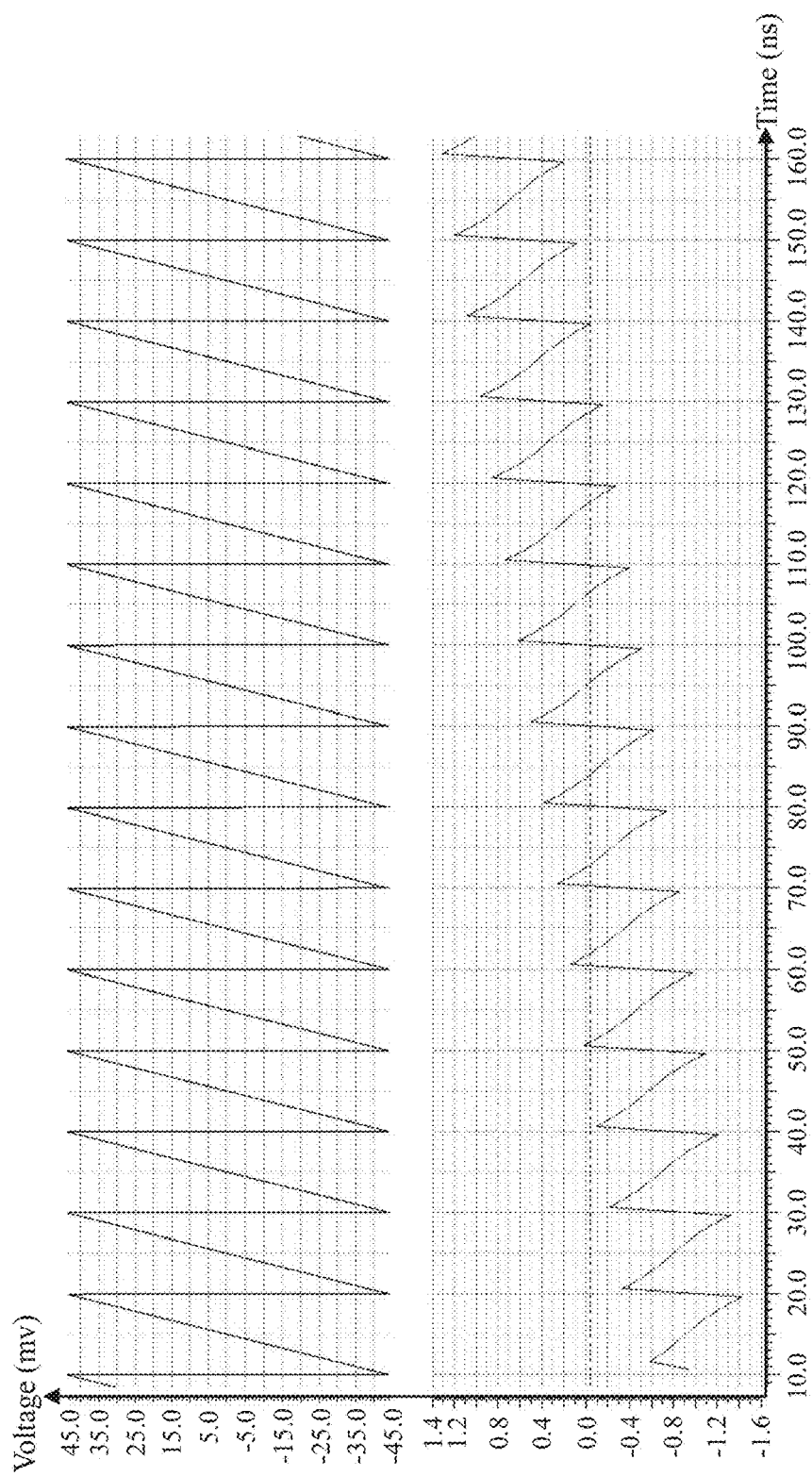
Figure 3C:
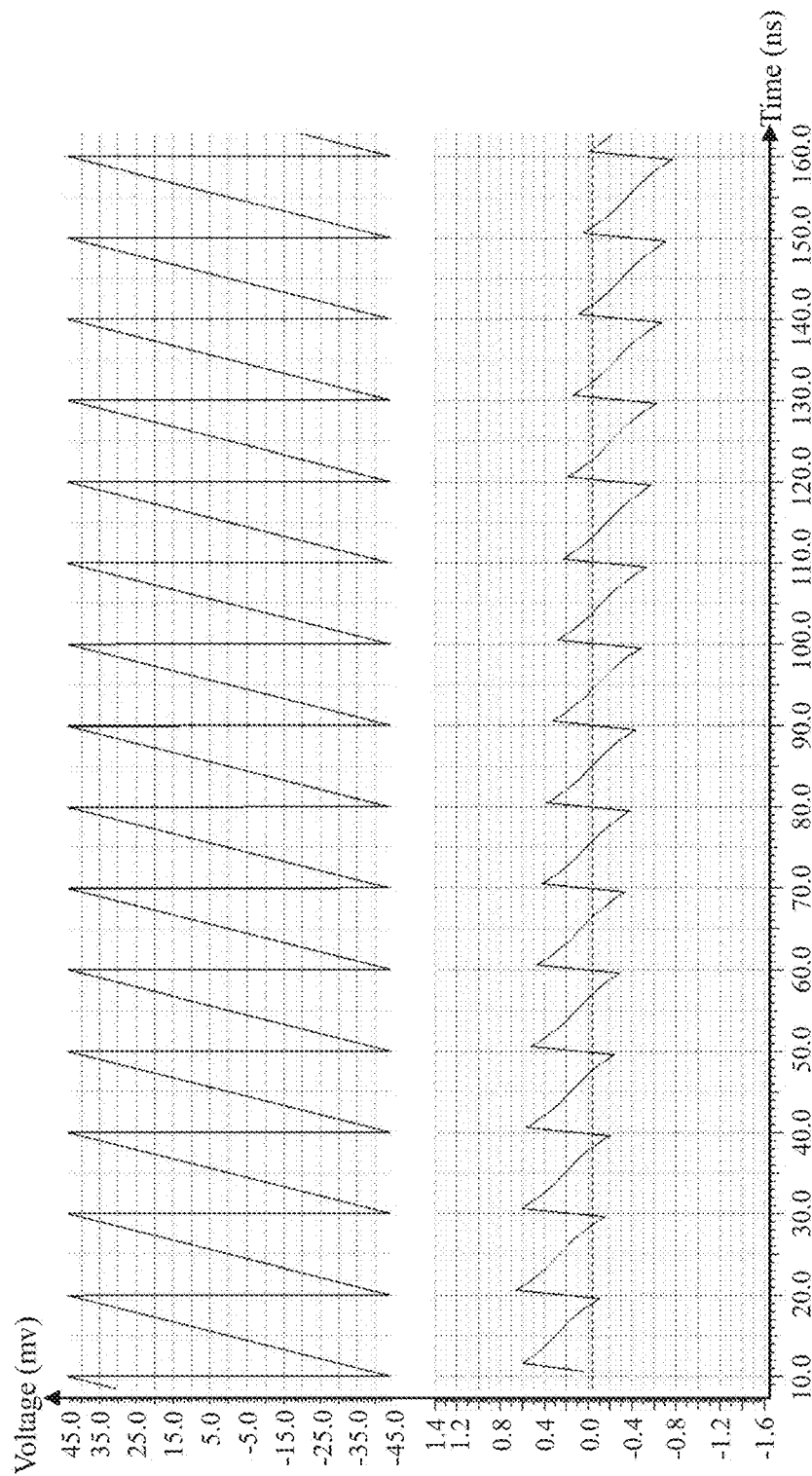

FIGS. 3A-3C show the differences in kickback voltages between the two input terminals of the comparator 205 corresponding to the ratio of the turn-on resistance of the PMOS to that of the NMOS being 1, 1.2, and 0.8, respectively. In FIGS. 3A-3C, the upper half and the lower half in each figure respectively show the input signal and the difference in kickback voltages, which is the difference in voltages between the two input terminals of the comparator 205 with the input signal deducted. The circuit uses a capacitor array corresponding to four bits as an example. From left to right, the 15 configurations of the capacitor array are sequentially switched (for example, the digital code B is sequentially switched from 0000 to 1111). For equal input signal (as shown in the upper half in FIGS. 3A-3C, the amplitude of the input signal is 45 mV), FIG. 3A shows the minimum difference in kickback voltage, while FIGS. 3B and 3C present more noticeable differences in kickback voltage. It can be concluded that the turn-on resistance mismatch between the PMOS and the NMOS causes a significant difference in kickback voltages between the two input terminals of the comparator, and the magnitude of the difference in kickback voltages is related to the configuration of the capacitor array.

When the resolution of the data converter is low (e.g., 10 bits or less), the signal-dependent kickback noise has less influence on the total harmonic distortion (THD) of the data converter. This is because the voltage difference corresponding to the least significant bit (LSB) is greater than kickback noise. However, when the resolution of the data converter becomes higher, the voltage difference corresponding to one LSB becomes smaller, and common-mode kickback noise of the comparator becomes more serious (due to the larger size of the comparator), making kickback noise impossible to ignore. In addition, because the reference voltages Vrefn and Vrefp have different driving capabilities, and the equivalent inductances of the inductors coupled to the reference voltages Vrefn and Vrefp are different, influence of kickback noise becomes more severe.

Figure 4:
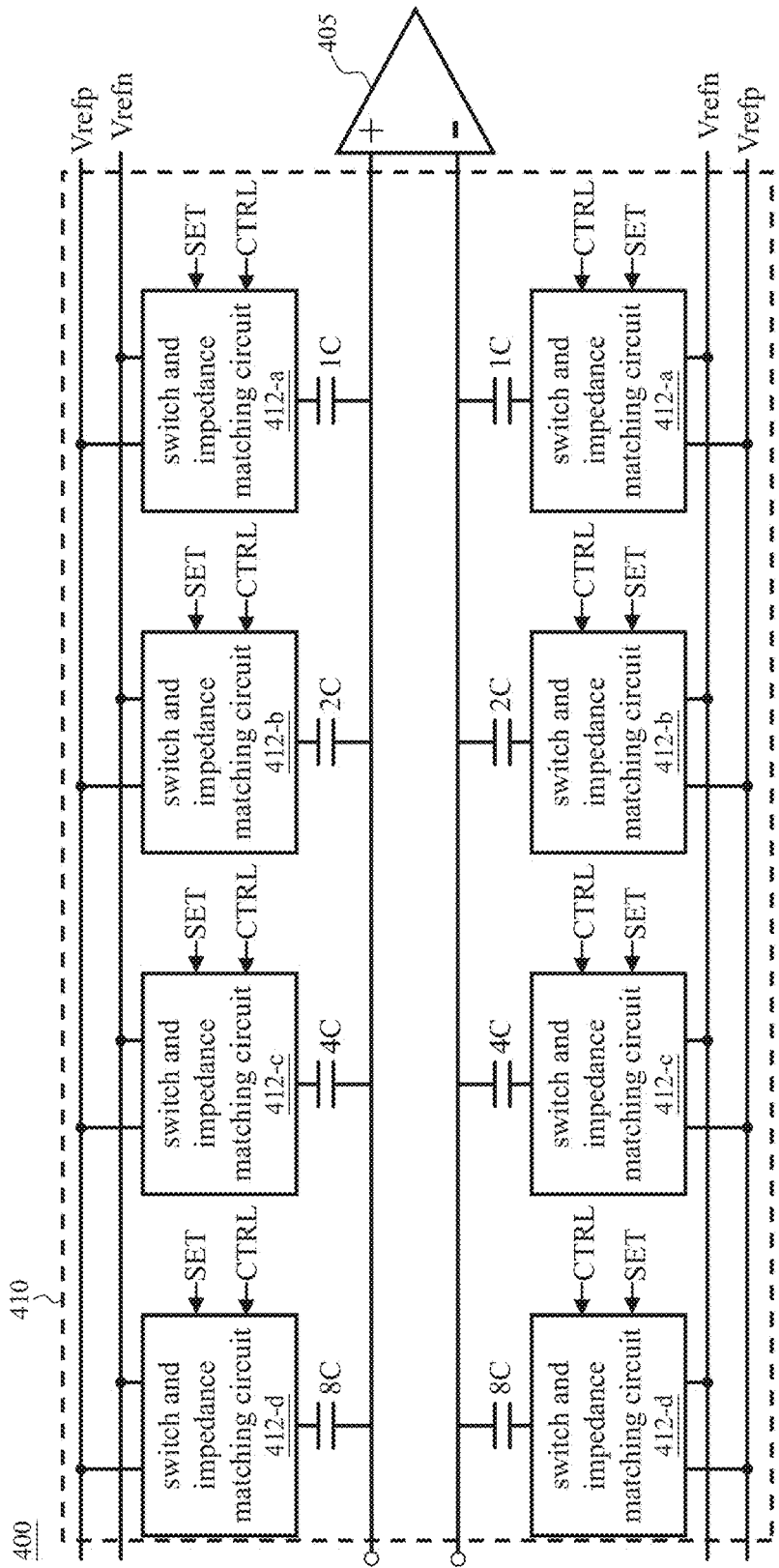
FIG. 4 illustrates a circuit diagram of a data converter according to one embodiment of this disclosure.
Figure 5:
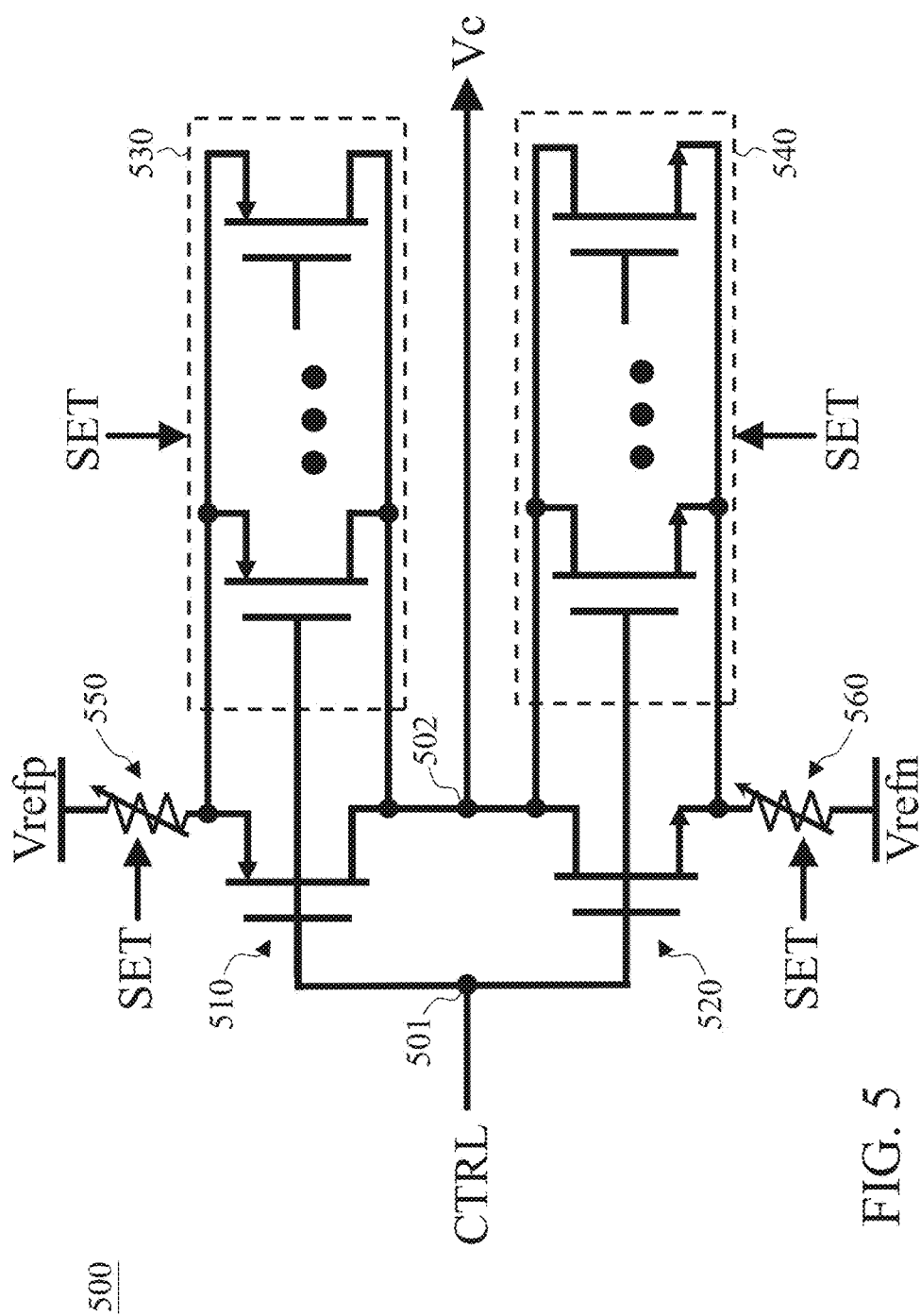
FIG. 5 illustrates a circuit diagram of a switch and impedance matching unit according to an embodiment of this disclosure.

FIG. 4 is a circuit diagram of a data converter according to one embodiment of this disclosure. The data converter 400 includes a comparator 405 and a DAC 410. Each capacitor of the capacitor array, which herein contains four capacitors 1C, 2C, 4C, and 8C as an exemplary embodiment, of the DAC 410 has one of its two ends coupled to the comparator 405 and the other coupled to the switch and impedance matching circuit 412. Each switch and impedance matching circuit 412 determines the switching states of its internal switches according to the control signal CTRL and determines its impedance according to the setting signal SET. A switching state of a switch refers to whether a capacitor is coupled to the reference voltage Vrefn or the reference voltage Vrefp. The control signal CTRL may be generated according to the digital code outputted by the successive approximation ADC employing the data converter 400. FIG. 5 is a circuit diagram of a switch and impedance matching unit 500 according to an embodiment of this disclosure. Each switch and impedance matching circuit 412 includes at least one switch and impedance matching unit 500. For example, in some embodiments, a unit capacitor is coupled to a switch and impedance matching unit 500, and so the switch and impedance matching circuits 412-a, 412-b, 412-c, and 412-d include one, two, four, and eight switch and impedance matching unit(s) 500, respectively.

Reference is made to FIG. 5. The switch and impedance matching unit 500 has a control terminal 501 and an output terminal 502. The output terminal 502 is coupled to a capacitor. The switch and impedance matching unit 500 includes a PMOS 510, an NMOS 520, a variable resistor 550, and a variable resistor 560 connected in series between the reference voltages Vrefn and Vrefp. The control signal CTRL controls the PMOS 510 or the NMOS 520 to turn on, making the output voltage Vc substantially equal to the reference voltage Vrefp or Vrefn. The PMOS array 530 includes at least one PMOS, and the NMOS array 540 includes at least one NMOS. The setting signal SET can determine: (1) the number of transistor(s) in the PMOS array 530 that is/are connected in parallel with the PMOS 510, the number being zero or at least one; (2) the number of transistor(s) in the NMOS array 540 that is/are in parallel with the NMOS 520, the number being zero or at least one; (3) the resistance value of the variable resistor 550; and (4) the resistance value of the variable resistor 560. Depending on practical adjustment requirements, part or all of the above four targets (i.e., the PMOS array 530, the NMOS array 540, the variable resistor 550, and the variable resistor 560) may be selectively adjusted through the setting signal SET.

It should be noted that two parallel-connected transistors have their gates electrically connected to each other, their drains electrically connected to each other, and their sources electrically connected to each other. In some embodiments, the drain and source of each PMOS in the PMOS array 530 are respectively coupled to switches, with the switch corresponding to the drain coupled to the drain of the PMOS 510, and the switch corresponding to the source coupled to the source of the PMOS 510. The switches are controlled by the setting signal SET. In some embodiments, the drain and source of each NMOS in the NMOS array 540 are respectively coupled to switches, with the switch corresponding to the drain coupled to the drain of the NMOS 520, and the switch corresponding to the source coupled to the source of the NMOS 520. The switches are controlled by the setting signal SET.

Figure 6:
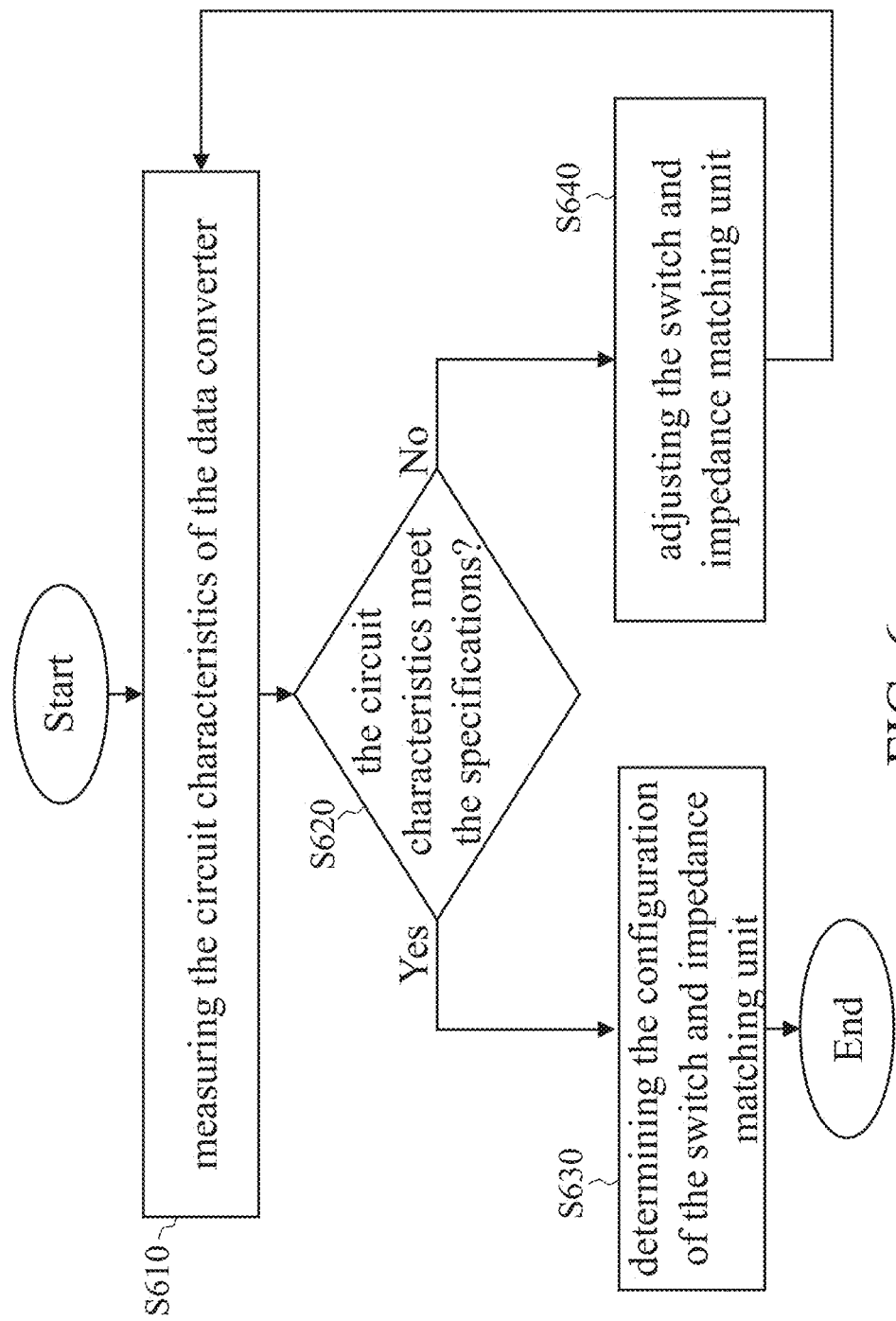
FIG. 6 illustrates a flowchart of an impedance matching control method for a data converter according to an embodiment of this disclosure.

FIG. 6 is a flowchart of an impedance matching control method for a data converter according to an embodiment of this disclosure. The circuit characteristics of the data converter are measured first (step S610). For example, a test signal is inputted to the data converter 400, and then a differential nonlinear (DNL) error or a signal-to-noise and distortion ratio (SNDR) is obtained according to the output of the data converter 400; alternatively, the difference in turn-on resistances between the PMOS and the NMOS can be obtained by performing a wafer acceptance test (WAT). Next, it is determined whether the circuit characteristics meet the specifications (step S620). If the result of step S620 is positive, the configuration of the switch and impedance matching unit 500 does not need to adjust, that is, the configuration of the switch and impedance matching unit 500 is thus determined (step S630). If the result of step S620 is negative, the switch and impedance matching unit 500 is adjusted according to the current circuit characteristics (step S640).

Step S640 sets the configuration of the switch and impedance matching unit 500 through the setting signal SET; more specifically, at least one of the following four targets is/are selectively adjusted: the PMOS array 530, the NMOS array 540, the variable resistor 550, and the variable resistor 560. For example, when the WAT shows that the turn-on resistance of the PMOS is greater than the turn-on resistance of the NMOS, the setting signal SET can (1) increase the number of the parallelly-connected transistors in the PMOS array 530; and/or (2) reduce the resistance value of the variable resistor 550; and/or (3) reduce the number of parallelly-connected transistors in the NMOS array 540; and/or (4) increase the resistance value of the variable resistor 560. When DNL or SNDR is used as a reference for the circuit characteristics, step S640 keeps adjusting the setting signal SET according to the distribution of DNL or SNDR until DNL or SNDR matches the specifications. When the adjustment is complete (i.e., the result of step S620 is positive), the number of parallel-connected transistors in the PMOS array 530 (or the NMOS array 540) is greater than or equal to zero, and the equivalent impedance between the output terminal 502 and the reference voltage Vrefp is substantially equal to the equivalent impedance between the output terminal 502 and the reference voltage Vrefn.

In some embodiments, the switch and impedance matching unit 500 does not include the variable resistor 550 and the variable resistor 560. In this case, the PMOS 510 and the NMOS 520 are directly coupled to the reference voltages Vrefp and Vrefn, respectively. In some embodiments, the switch and impedance matching unit 500 does not contain the PMOS array 530 and the NMOS array 540. In this case, the impedance matching of the switch and impedance matching unit 500 is adjusted through the variable resistor 550 and the variable resistor 560. The variable resistor 550 and the variable resistor 560 can increase the linearity of the resistance value of the switch and impedance matching unit 500. In some embodiments, the variable resistor 550 and variable resistor 560 may be voltage-controlled resistors.

Since a person having ordinary skill in the art can appreciate the implementation detail and the modification thereto of the present method embodiment through the disclosure of the device embodiment, repeated and redundant description is thus omitted. Please note that there is no step sequence limitation for the method embodiments as long as the execution of each step is applicable. Furthermore, the shape, size, and ratio of any element and the step sequence of any flow chart in the disclosed figures are exemplary for understanding, not for limiting the scope of this disclosure.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A data converter comprising:
    a comparator having a first input terminal and a second input terminal;
    a capacitor array comprising a plurality of capacitors, wherein a first end of each capacitor is coupled to the first input terminal or the second input terminal; and
    a switch and impedance matching circuit coupled to a second end of a target capacitor among the capacitors and configured to couple the second end to a first reference voltage or a second reference voltage according to a control signal and adjust an impedance according to an impedance adjusting signal, wherein the impedance is the impedance of the switch and impedance matching circuit;
    wherein the first reference voltage is different from the second reference voltage;
    wherein the switch and impedance matching circuit comprises:
        a control terminal receiving the control signal;
        an output terminal coupled to the second end of the target capacitor and configured to output the first reference voltage or the second reference voltage;
        a first switch coupled between the output terminal and the first reference voltage;
        at least one second switch;
        a third switch coupled between the output terminal and the second reference voltage; and
        at least one fourth switch;
        wherein under the control of the impedance adjusting signal, one of the at least one second switch is connected in parallel with the first switch, and/or one of the at least one fourth switch is connected in parallel with the third switch.

2. The data converter of claim 1, wherein the switch and impedance matching circuit further comprises:
    a first variable resistor coupled between the output terminal and the first reference voltage and connected in series with the first switch; and
    a second variable resistor coupled between the output terminal and the second reference voltage and connected in series with the third switch;
    wherein the resistance value of the first variable resistor and the resistance value of the second variable resistor are controlled by the impedance adjusting signal.

3. The data converter of claim 1, wherein after the impedance adjustment, the switch and impedance matching circuit makes equivalent impedance between the second end of the target capacitor and the first reference voltage substantially equal to the equivalent impedance between the second end of the target capacitor and the second reference voltage.

4. A data converter comprising:
a comparator having a first input terminal and a second input terminal;
a capacitor array comprising a plurality of capacitors, wherein a first end of each capacitor is coupled to the first input terminal or the second input terminal; and
a switch and impedance matching circuit coupled to a second end of a target capacitor among the capacitors and configured to couple the second end to a first reference voltage or a second reference voltage according to a control signal and adjust an impedance according to an impedance adjusting signal, wherein the impedance is the impedance of the switch and impedance matching circuit;
wherein the first reference voltage is different from the second reference voltage;
wherein the switch and impedance matching circuit comprises:
a control terminal receiving the control signal;
an output terminal coupled to the second end of the target capacitor and configured to output the first reference voltage or the second reference voltage;
a first switch coupled between the output terminal and the first reference voltage;
a plurality of second switches;
a third switch coupled between the output terminal and the second reference voltage; and
a plurality of fourth switches;
wherein under the control of the impedance adjustment signal, N of the second switches are connected in parallel with the first switch, M of the fourth switches are connected in parallel with the third switch, and M and N are integers greater than or equal to zero.

5. The data converter of claim 4, wherein after the impedance adjustment, the switch and impedance matching circuit makes equivalent impedance between the second end of the target capacitor and the first reference voltage substantially equal to the equivalent impedance between the second end of the target capacitor and the second reference voltage.

6. A data converter comprising:
a comparator having a first input terminal and a second input terminal;
a capacitor array comprising a plurality of capacitors, wherein a first end of each capacitor is coupled to the first input terminal or the second input terminal; and
a switch and impedance matching circuit coupled to a second end of a target capacitor among the capacitors and configured to couple the second end to a first reference voltage or a second reference voltage according to a control signal and adjust an impedance according to an impedance adjusting signal, wherein the impedance is the impedance of the switch and impedance matching circuit;
wherein the first reference voltage is different from the second reference voltage;
wherein the switch and impedance matching circuit comprises:
a control terminal receiving the control signal;
an output terminal coupled to the second end of the target capacitor and configured to output the first reference voltage or the second reference voltage;
a first switch coupled between the output terminal and the first reference voltage;
a second switch coupled between the output terminal and the second reference voltage;
a first variable resistor coupled between the output terminal and the first reference voltage and connected in series with the first switch; and
a second variable resistor coupled between the output terminal and the second reference voltage and connected in series with the second switch;
wherein the resistance value of the first variable resistor and the resistance value of the second variable resistor are controlled by the impedance adjusting signal.

7. The data converter of claim 6, wherein after the impedance adjustment, the switch and impedance matching circuit makes equivalent impedance between the second end of the target capacitor and the first reference voltage substantially equal to the equivalent impedance between the second end of the target capacitor and the second reference voltage.

* * * * *